United States Patent
Fork et al.

(10) Patent No.: US 8,080,181 B2
(45) Date of Patent: Dec. 20, 2011

(54) COEXTRUSION INK CHEMISTRY FOR IMPROVED FEATURE DEFINITION

(75) Inventors: David K. Fork, Los Altos, CA (US);
Ranjeet Rao, Mountain View, CA (US);
Frank Benner, Ketzerbachtal (DE)

(73) Assignee: SolarWorld Innovations GmbH, Freiberg/Saxony (DE)

( * ) Notice: Subject to any disclaimer, the term of this patent is extended or adjusted under 35 U.S.C. 154(b) by 778 days.

(21) Appl. No.: 12/119,727

(22) Filed: May 13, 2008

(65) Prior Publication Data

US 2009/0286069 A1    Nov. 19, 2009

(51) Int. Cl.
*H05K 3/46* (2006.01)
(52) U.S. Cl. .......... 252/518.1; 222/129; 252/500
(58) Field of Classification Search .......... 428/220; 252/518.1; 222/129
See application file for complete search history.

(56) References Cited

U.S. PATENT DOCUMENTS

| | | |
|---|---|---|
| 2007/0107773 A1 | 5/2007 | Fork et al. |
| 2007/0108229 A1 | 5/2007 | Fork et al. |
| 2007/0110836 A1 | 5/2007 | Fork et al. |
| 2007/0169806 A1 | 7/2007 | Fork et al. |
| 2008/0099952 A1 | 5/2008 | Fork et al. |
| 2008/0099953 A1 | 5/2008 | Fork et al. |
| 2008/0102558 A1 | 5/2008 | Fork et al. |
| 2008/0138456 A1 | 6/2008 | Fork et al. |
| 2009/0107546 A1 | 4/2009 | Allison et al. |

FOREIGN PATENT DOCUMENTS

| | | |
|---|---|---|
| EP | 0 519 175 A | 12/1992 |
| EP | 0519175 A2 * | 12/1992 |
| EP | 1 787 785 A | 5/2007 |
| EP | 1 918 026 | 5/2008 |
| WO | WO 2007/018426 | 2/2007 |

OTHER PUBLICATIONS

Van Hoy et al., "Microfabrication of Ceramics by Co-Extrusion", Journal of the American Ceramic Society, vol. 81, No. 1, pp. 152-158 (1998).
U.S. Appl. No. 11/926,405, filed Oct. 29, 2007 to Allison et al.
U.S. Appl. No. 11/555,479, filed Nov. 1, 2006 to Fork et al.
U.S. Appl. No. 11/555,512, filed Nov. 1, 2006 to Fork et al.
U.S. Appl. No. 11/555,496, filed Nov. 1, 2006 to Fork et al.
U.S. Appl. No. 11/336,714, filed Jan. 1, 2006 to Fork et al.
U.S. Appl. No. 11/609,825, filed Dec. 12, 2006 to Fork et al.

* cited by examiner

*Primary Examiner* — Harold Pyon
*Assistant Examiner* — Timothy Chiang
(74) *Attorney, Agent, or Firm* — Oliff & Berridge, PLC

(57) ABSTRACT

Improved coextruded ribbons of material, such as can be used for making relatively fine conductive or ceramic lines or structures, having relatively high aspect ratios, are provided. The inks used to form the coextruded structures lack a yield stress and a high viscosity, but react at their interface to form a material having a finite yield stress or a high viscosity. This material then supports the shape of the extruded ink such that structures can be formed therefrom.

12 Claims, 1 Drawing Sheet

COEXTRUSION INK CHEMISTRY FOR IMPROVED FEATURE DEFINITION

CROSS-REFERENCE TO RELATED APPLICATIONS

Disclosed in commonly assigned U.S. patent application Ser. No. 11/926,405, filed Oct. 29, 2007, is a sacrificial feedstock for extrusion of ribbons. The ribbons comprise sacrificial extrudate and high-aspect-ratio functional material, wherein the sacrificial feedstock comprises an organic polymer, a solvent, and one or more optional additives. The sacrificial feedstock has a yield strength of greater than about 100 Pa or a viscosity of greater than about $10^4$ cP at a shear rate of less than about 10 $\sec^{-1}$ to enable the ribbon to maintain structural integrity.

Disclosed in commonly assigned U.S. patent application Ser. No. 11/282,882, filed Nov. 17, 2005, now U.S. Patent Publication No, 2007-0110836 A1, is a device for extruding/dispensing materials on a substrate, comprising: a housing; at least two channels enclosed by the housing, the at least two channels facilitate flow of materials; at least one entrance port associated with each of the channels for feeding a material into each channel; and an exit port for co-extruding/dispensing the materials to generate a relatively fine feature with a relatively high aspect ratio. Also disclosed is a solar cell structure, comprising: a substrate; at least one gridline formed on the substrate; separate localized transparent support structures that surround each gridline; and a layer formed over the resultant separate localized transparent support structures and the substrate.

Disclosed in commonly assigned U.S. patent application Ser. No. 11/282,829, filed Nov. 17, 2005, now U.S. Patent Publication No. 2007-0108229 A1, is a method for extruding/dispensing composite materials, comprising: feeding a first material into a first channel used to extrude/dispense the first material, feeding a second material used to maintain a shape of the first material into one or more second channels residing on at least one side of the first channel; merging the flow of the first material and the flow of the second material into a single flow in which the second material surrounds the first material; applying the single flow to a substrate to produce at least one composite material; and post-processing the dispensed composite material to form a solid.

Disclosed in commonly assigned U.S. patent application Ser. No. 11/555,479, filed Nov. 1, 2006, is a method for forming a plurality of closely spaced high-aspect ratio gridline structures on a substrate, the method comprising: disposing first and second co-extrusion heads adjacent to a surface of the substrate such that first outlet orifices of the first co-extrusion head define a first line extending in a first direction, and second outlet orifices of the second co-extrusion head define a second line that is separated from and parallel to the first line; moving the first and second co-extrusion heads relative to the substrate in a second direction while extruding gridline material and a sacrificial material through each of the first and second outlet orifices such that said gridline material extruded from each of the first and second outlet orifices forms an associated high-aspect ratio gridline structure, and said sacrificial material extruded from each of the first and second outlet orifices forms associated first and second sacrificial material portions respectively disposed on opposing sides of said associated high-aspect ratio gridline structure, wherein the first said outlet orifices and the second said outlet orifices are disposed in a staggered arrangement such that a first said high-aspect ratio gridline structure extruded from the first co-extrusion head is disposed between second and third said high-aspect ratio gridline structures extruded from the second co-extrusion head.

The entire disclosures of the above-mentioned applications are incorporated herein by reference.

TECHNICAL FIELD

This disclosure is generally directed to extruded ribbons of material, such as can be used for making relatively fine lines or structures of functional materials such as conductors or ceramics, having relatively high aspect ratios, and materials that can be used in such extruded ribbons of material. More particularly, in embodiments, this disclosure is directed to a coextrusion ink system that forms a material having a finite yield stress or a high viscosity at the interface of a first ink lacking a yield stress and a high viscosity and a second ink, or sacrificial material, which also lacks a yield stress and a high viscosity.

BACKGROUND

In traditional extrusion processes a billet of a single type of material is pushed and/or drawn through a printhead to create a rod, rail, pipe, or other similar structure. Various applications leverage this capability. For instance, extrusion can be used with food processing applications to create pasta, cereal, snacks, etc.

However, conventional extrusion techniques are limited. For example, conventional techniques cannot render relatively high aspect-ratio, fine featured (e.g., less then 5 micron) porous (e.g., 0.01 mm RMS) structures at an economical cost. Thus, conventional extrusion typically is not used for creating conducting contacts and/or channels for electrochemical (e.g., fuel), solar, and/or other types of cells, which leverage high aspect-ratio fine featured porous structures to increase efficiency and electrical power generation.

Coextrusion, generally, is the process of extruding two or more different materials through a printhead die to create a coextruded structure. For example, extruded flows of first and second inks are merged into a single flow in which the second ink surrounds the first ink. The single flow is then applied to a substrate to produce at least one composite material. Coextrusion can be used, for example, to create high aspect-ratio, micron level sized, structures for use in solar cells or fuel cells. See U.S. Patent Application Publication No. 2007/0108229, the disclosure of which is incorporated herein in its entirety.

Unfortunately, coextrusion processes suffer from several disadvantages. Specifically, when two dissimilar materials are coextruded they may mix at their interface. Such mixing is undesirable because it degrades the printing resolution and also lowers the aspect ratio of the printed structure. Additionally, coextruded structures may not achieve high aspect-ratios unless the coextruded materials have a sufficiently high yield stress or viscosity, such that the coextruded structure does not slump under the effects of, for example, gravitational force, in the timescale needed for processing. The sufficiently high yield stress ensures that for stresses below this limit, the ink behaves as a solid instead of a liquid, causing it to maintain its shape. An ink with a sufficiently large viscosity will also maintain its shape, provided that the timescale between printing and post-processing (e.g. drying, firing, etc) is short compared to the timescale of viscous relaxation.

In order to overcome this disadvantage, inks having high yield stresses or very high viscosities can be used. A high yield stress or high viscosity reduces mixing between the two inks and enables high aspect-ratios, but unfortunately introduces further disadvantages. An ink having a high yield stress or high viscosity will experience a large drop in pressure as it flows through the fluidic channels of the coextrusion device. Such materials thus generally require high pressure operation. However, low pressure operation of the coextrusion device is desirable because it enable a wider set of construction techniques for the printhead of the coextrusion device, as well as reducing the amount of wear on the printhead during operation. Furthermore, an ink which posseses a high yield stress and/or a high viscosity may be more likely to clog the printhead than an ink that flows with an arbitrarily low shear stress.

Therefore, there is a need in the art for a coextrusion system that comprises inks having low yield stress values or low viscosities, and precludes mixing of the inks or clogging of the printhead while enabling high aspect-ratio coextruded structures.

SUMMARY

The present disclosure addresses these and other needs, by providing an improved ink set wherein a first ink and one of a second ink or sacrificial material, all substantially lacking a yield stress and a high viscosity, form a material having a finite yield stress or having a high viscosity at their interface.

In embodiments, the disclosure provides an ink set comprising a first ink substantially lacking a yield stress and a high viscosity; one of a second ink or a sacrificial material, the second ink or sacrificial material substantially lacking a yield stress and a high viscosity; wherein a material having a finite yield stress or a high viscosity is formed at an interface of the first ink and the one of the second ink or sacrificial material as a result of localized mixing of the first ink and the one of the second ink or sacrificial material.

In other embodiments, the disclosure provides a printed substrate comprising a substrate; and a bead located on the substrate; wherein the bead comprises a first ink substantially lacking a yield stress and high viscosity, and one of a second ink or a sacrificial material, the second ink or sacrificial material substantially lacking a yield stress and high viscosity; wherein the first ink is situated in a first region of the bead, and the one of the second ink or sacrificial material is situated in an adjacent second region of the bead; and the bead further comprises a material having a finite yield stress or high viscosity between the first ink and the one of the second ink or sacrificial material.

EMBODIMENTS

Figure 1:
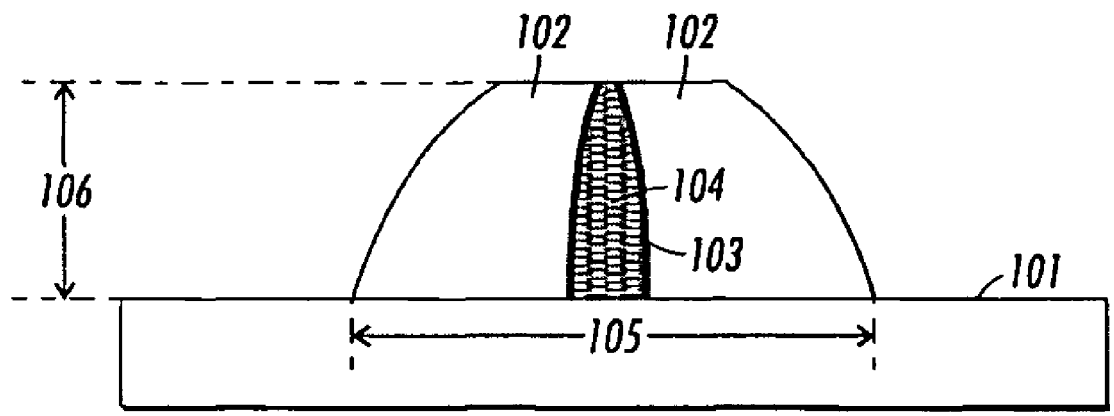
FIG. 1 shows an embodiment of a coextruded print system according to the present disclosure.

This disclosure is not limited to particular embodiments described herein, and some components and processes may be varied by one of ordinary skill in the art, based on this disclosure. The terminology used herein is for the purpose of describing particular embodiments only, and is not intended to be limiting.

In this specification and the claims that follow, singular forms such as "a," "an," and "the" include the plural forms unless the content clearly dictates otherwise. In addition, reference may be made to a number of terms that shall be defined as follows:

The term "aspect ratio" refers, for example, to a comparison of the thickness of a structure and the width of the structure, where the thickness, or height, of the structure is taken as the dimension normal to the substrate. The ratio can be expressed either as a ratio (such as thickness:width) or as a number (such as thickness divided by width). Thus, when referring to a conductive metal line that has a thickness or height of 100 microns and a width of 50 microns, the aspect ratio can be expressed as 2:1 or 2.0.

The term "yield stress" refers, as is known, to the amount of stress required to permanently (plastically) deform a material. For a viscoelastic material, the yield stress is, generally, a measure of the fluid's initial resistance to flow.

The term "substantially lacking a yield stress" refers, for example, to a material having a yield stress of less than about 100 Pascal (Pa).

The term "a finite yield stress" refers, for example, to a material having a yield stress of greater than about 100 Pa.

The term "high viscosity" refers, for example, to a material having a zero-shear viscosity of greater than about 50 Pa*s. Accordingly, the phrase "substantially lacking a high viscosity" refers to a material having a zero-shear viscosity of less than about 50 Pa*s.

The term "ink" as used herein is defined as a composition including a material in a solvent medium that is used to mark a substrate. An ink may be filled with a functional material comprising solid particles when, for example, the mark on the substrate is a structure. An ink may also be unfilled, lacking solid particles, but containing other functional materials such as metalorganic compounds, dissolved salts or other materials that form solids through means such as drying, thermal processing, decomposition, sublimation or pryrolysis.

An improved coextrusion ink set is provided comprising a first ink substantially lacking a yield stress and a high viscosity; and one of a second ink substantially lacking a yield stress and a high viscosity or a sacrificial material substantially lacking a yield stress and a high viscosity; wherein a material having a finite yield stress or high viscosity is formed at an interface of the first ink and the second ink or sacrificial material as a result of localized mixing of the first ink and the second ink or sacrificial material.

The first ink may comprise any suitable ink materials depending upon the end objectives of the process, so long as the ink substantially lacks a yield stress and a high viscosity. For example, the first ink may comprise a functional ink that is filled with solid particles that, after processing, form a coextruded structure.

In embodiments, when the first ink is a functional ink, any suitable functional material can be used. Generally, a functional ink may contain solid particles comprised of, for example, metal, ceramic, polymer, semiconductor, or the like as the coextrusion process requires for a particular application. For example, where the objective is to form conductive lines on a substrate, the first ink can comprise a conductive ink. In another example, where the objective is to form ceramic lines on a substrate, the first ink can include a ceramic material such that when the extruded ribbon of functional material is fired, the result is a pattern of ceramic lines. In a similar manner, the first ink can comprise photoresist materials such that when the extruded ribbon of functional material is fired, the result is a pattern of photoresist lines of the desired high aspect ratio. In a still further embodiment, the first ink can include semiconductor dopant materials, such as materials that can migrate from the functional material into an underlying semiconductor substrate. Compositions of these, and other, functional materials will be apparent to those skilled in the art.

In particular, when the first ink is a conductive ink, for example, any suitable conductive ink can be used in embodiments, including a wide range of conductive inks that are well known in the art, particularly for forming conductive lines for solar cell applications. Such conductive inks generally comprise metal particles, an electronic glass, and an organic component, where the organic component can include, for example, a solvent, a combined plasticizer/solvent material, organic polymer, gelling agents, and the like. Generally, the first any can be any known conductive ink so long as it lacks a yield stress or a high viscosity, and contains the components necessary to form the material having a finite yield stress or high viscosity.

The organic component is generally a solution of polymeric binder in an organic solvent, also called the organic medium. The main purpose of the organic medium is to serve as a vehicle for dispersion of the finely divided solids of the composition in such form that it can readily be applied to ceramic, silicon, or other substrates. Thus, the organic medium generally is one in which the solids are dispersible with an adequate degree of stability, and in which the rheological properties are such that they lend good application properties to the dispersion. Generally, the polymeric binder acts as a viscosifier, and so the ink may only contain an amount of polymeric binder that does not result in a high viscosity.

In view of these criteria, a wide variety of polymers and solvents can be used as the principal dispersion medium. The dispersion medium for most thick film compositions is typically a solution of resin in a solvent, frequently also containing one or more thixotropic agents, gelling agents, plasticizers, co-solvents, wetting agents, or the like. The solvent usually boils within the range of about 130 to about 350° C. However, gelling agents generally cause the ink to have a yield stress by promoting network formation, and so the ink may only contain gelling agents to the degree that the presence of gelling agents does not result in the ink having a yield stress.

Suitable solvents include kerosene, mineral spirits, terpineol, esters of phthalic acid, such as dibutyl phthalate, butyl carbitol, butyl carbitol acetate, hexylene glycol, aliphatic di-esters, such as the ethyl and butyl esters of adipic and sebacic acids and high-boiling alcohols and alcohol esters. Water-soluble solvent systems can also be used.

The ratio of organic medium to solid particles in the ink composition dispersions can vary considerably and depends upon the manner in which the dispersion is to be applied and the kind of organic medium used. Normally, to achieve good coverage, the dispersions will contain complementally by weight 40-90% solids and 60-10% organic medium. For example, the composition of embodiments may contain 45-65% by weight inorganic solids and 55-35% by weight organic medium, where the weight of the inorganic solids includes the weight of both the metal and glass materials. Generally, the solid particles can comprise at least about 20% of the total volume of the ink.

Of course, the content of the ink composition, such as the content of solid particles or the solvent used, can be adjusted so as to adjust the rheological properties of the ink composition. The ink has a composition such that it substantially lacks a yield stress and a high viscosity, i.e. has a yield stress of less than about 100 Pa and a zero-shear viscosity of less than about 50 Pa*s. As a result of substantially lacking a yield stress and a high viscosity, the ink composition can easily be passed through the extruder printhead, without the need for large amounts positive or negative pressure. Formulation of an ink composition substantially lacking a yield stress and a high viscosity can be accomplished by standard means known in the art. For example, an ink composition lacking a high viscosity can be accomplished by reducing the molecular weight and/or the loading of the organic polymer in the particular material and by reducing the molecular weight of any plasticizer that may be present. An ink composition lacking a yield stress can be accomplished by minimizing or eliminating the use of gelling agents, by using solvents that wet or dissolve all ink components, by addition of dispersants, by adjusting solvent pH such that all particles and polymers within have a similar electrostatic charge, and by any other method that promotes repulsive interactions between solid particles or polymer molecules within the ink.

Next, in embodiments, the improved coextrusion ink set of the present disclosure may comprise a second ink also substantially lacking a yield stress and a high viscosity. The second ink generally has a composition as discussed above with regard to the first ink. Specifically, the second ink may be the same as the first ink, or of a different composition, as desired. In embodiments, the first and second inks may be substantially the same but comprise different functional particles. For example, when the first ink is a conductive ink comprising conductive particles, the second ink may also be a conductive ink but comprising a different type of conductive particles. In another embodiment, certain fuel cell electrodes consist of interdigitated fingers of hydrophilic and hydrophobic materials. These materials can be, for example, porous carbon and porous polytetrafluoroethylene (PTFE, commonly known as Teflon). This structure may therefore be formed from a first ink containing carbon particles and a second ink containing PTFE particles. However, the composition of the second ink will differ from the composition of the first ink with regard to the components therein that form a material having a finite yield stress or high viscosity, as discussed below.

In other embodiments, the improved coextrusion ink set of the present disclosure may comprise a sacrificial material instead of a second ink. A sacrificial material, as disclosed in U.S. patent application Ser. No. 11/926,405 herein incorporated in its entirety, is a material that is removed during processing of a coextruded structure without substantially marking a substrate. The sacrificial material also substantially lacks a yield stress and a high viscosity.

In embodiments, the sacrificial material desirably has some or all of the following properties: (1) it does not include, completely or substantially, any filler materials; (2) it completely burns out during firing or sintering of the coextruded composition, such that the sacrificial feedstock is completely or substantially removed from the substrate; and (3) it has rheological properties, such as viscosity and the like, that completely or substantially match the rheological properties of the first ink composition with which it is coextruded.

Generally, the sacrificial material can be of substantially the same composition as the first ink, described in detail above, except that the solid particles are excluded from the sacrificial material. That is, the sacrificial material can correspond to, and in embodiments has the same components as, the organic component of the functional ink composition. However, the proportions of the organic components will differ in order to achieve the desired similarity in viscosity and other rheological properties to the first ink. Thus, for example, the sacrificial feedstock may generally comprise an organic component, where the organic component can include, for example, a solvent, a combined plasticizer/solvent material, organic polymer, viscosity modifiers or builders, gelling agents, thixotropic agents, and the like. Of course, as discussed with respect to the first ink, the sacrificial feedstock should only contain, for example, viscosifiers or gelling agents to the extent that the presence of these components does not result in a finite yield stress or a high viscosity. All of these materials, and others, that can be used in forming the organic component of an ink composition, and thus that can form the basis of the sacrificial feedstock, are discussed above. However, the composition of sacrificial material will differ from the composition of the first ink with regard to the components therein that form a material having a finite yield stress or a high viscosity, as discussed below.

As mentioned, the sacrificial feedstock in embodiments can be of substantially the same composition as the organic component of the ink composition, or it can be of a different composition. Where the same composition is used, the properties of the sacrificial feedstock can be adjusted as necessary, for example to approach or equal the properties of the ink composition itself. Closely matched rheological properties, such as yield strength or viscosity, are generally desired so that an extrusion or co-extrusion process can be conducted more easily with the two compositions. When necessary, the rheological properties, such as yield strength or viscosity, can be adjusted by several means known in the art. For example, the viscosity of the sacrificial feedstock can be adjusted by adjusting (increasing or decreasing, as appropriate) the weight percent content of the organic polymer, by adjusting the molecular weight of the organic polymer, and adding or adjusting the content of a thickening agent, and the like. The yield strength of the sacrificial feedstock can be adjusted by adjusting the amount of a gelling agent, by increasing the volume fraction of the gelled component, or by any other method that promotes attractive interactions between particles or polymer molecules in the sacrificial ink. Such adjustments can be made, for example, by routine experimentation to closely match the properties of the ink composition or other functional material.

In embodiments, the sacrificial feedstock and the ink composition may be closely matched or substantially the same in one or more rheological properties. Since the co-extrusion process involves flows that are "mixed," i.e. have both extensional and shear components, it is appropriate that the matching be in both shear and extensional rheological properties. Moreover, since the flows involve local shear and deformation rates that may vary by orders of magnitude, matching of both "weak flow" and "strong flow" properties should be considered. Finally, the extrusion is a free surface flow, so surface properties should be considered as well. Thus, for example, matching can be in terms of shear and extensional viscosity (at all relevant shear and extension rates), loss and storage modulus, primary and secondary normal stress coefficient (at all relevant shear rates), elastic flow relaxation time, flow consistency index (which is the coefficient for a power-law fluid), flow behavior index (which is the exponent for a power law fluid), yield stress, surface tension and the like. In embodiments, the sacrificial feedstock and the ink composition are closely matched or substantially the same in at least the shear viscosity and yield strength, and desirably one or more other properties. In other embodiments, the sacrificial feedstock and the ink composition are closely matched in at least two, at least three, or at least four or more of the above mentioned properties.

The first ink and the second ink or sacrificial material further comprise components such that a material having a finite yield stress or a high viscosity will be formed at their interface. The material having a finite yield stress or a high viscosity forms as a thin layer between the first ink and the second ink or sacrificial material when the two are contacted at an interface during a coextrusion process. A variety of chemical or physical reactions may be used to form the material having a finite yield stress or a high viscosity, so long as the components before formation of the material substantially lack a yield stress and a high viscosity.

For example, in embodiments, the material having a finite yield stress or a high viscosity may be formed through a polymerization reaction. In such embodiments, the first ink may contain, for example, one monomer required by the polymerization reaction. The second ink or sacrificial material may then either contain a catalyst or cross-linking agent, or it may contain a second monomer required by the polymerization reaction as well as a catalyst or cross-linking agent. For example, the first ink can contain an organic solvent, particles of a functional material such as Teflon, and a photopolymerizable monomer such as trimethylpropane triacrylate (TMPTA), while the second ink contains an organic solvent, and an initiator for the photopolymerization such as diethoxyacetophenone (DEAP). UV exposure subsequent to co-extrusion will polymerize the interface of the two inks, where the monomer and photoinitiator are both present.

In other embodiments, the material having a finite yield stress or a high viscosity may be formed through gelation. Gelation may be accomplished through various known gelation processes, including through the formation of chemical bonds between particles using a cross-linker, or through the creation of attractive forces between particles. When gelation is accomplished through chemical bonding, the first ink may contain, for example, any of various known gelling agents, while the second ink or sacrificial material may include a cross linking agent, or vice versa. Common gelling agents include, for example, waxes, silicic (silica gels) acids, fumed silica, synthetic polymers, or biopolymers such as galactomannan gums, cellulosic polymers, and other polysaccharides. Cross linking agents may comprise, for example, fatty acid soaps, metal ions, a metal salt or complex, charged polyelectrolytes, or metal alkoxides containing boron, aluminum, silicon, antimony, zirconium, magnesium, or titanium.

In particular embodiments, gelation or an increase in viscosity may occur due to electrostatic attraction between solid particles. In this embodiment, the solid particles present in the first ink have a first net electrostatic charge, while either the second ink contains solid particles having an opposite net electrostatic charge or the sacrificial material includes a component having an opposite net electrostatic charge. In this embodiment, the thickness of the material having a finite yield stress or high viscosity is particularly self-limiting. The thickness will be self-limiting because the solid particles have poor diffusivity, such that the interaction between the first ink and the second ink will not extend substantially beyond the immediate vicinity of the interface of the first ink and second ink or sacrificial material. For example, if the first ink is composed of poly(acrylic acid) coated barium titanate particles in an aqueous solvent at pH 9, and the sacrificial ink contains polyethyleneimine molecules at pH 9, the interface will viscosify and/or gel when the negatively charged aluminum oxide particles mix with the positively charged polyethyleneimine molecules.

The material having a finite yield stress or a high viscosity ("the material") posses a variety of physical characteristics that make it appropriate for use in a coextrusion system. For example, the material forms between the first ink and second ink or sacrificial material such that no further mixing between the two initial coextruded components is possible. In other words, the material having a finite yield stress or a high viscosity acts as a diffusion barrier. In this way, undesirable mixing of the two coextruded components is substantially prevented.

The material may have a finite yield stress, in that the material has a yield stress value of at least about 100 Pa. In embodiments, the material may have a yield stress value of greater than about 1,000 Pa. Alternately, the material may have a high viscosity, in that the zero-shear viscosity is greater than about 50 Pa*s. In embodiments, the zero-shear viscosity may be greater than about 100 Pa*s.

The coextrusion ink set can be applied to a substrate in any suitable or desired manner. A number of application devices can be used for applying the ink set to the substrate. Desirably, the ink set is applied to the substrate using a coextrusion device, as such devices allow for the two materials to be reliably and uniformly applied to the substrate, with the first ink and one of the second ink or sacrificial material in mutual intimate contact along their boundary so as to form the material having a finite yield stress or a high viscosity. Suitable coextrusion devices are disclosed, for example, in U.S. Patent Publications Numbers 2007-0110836 A1, 2007-0108229 A1, and 2007-0107773 A1, and U.S. patent application Ser. Nos. 11/336,714, 11/555,479, 11/555,512, 11/555,496, and 11/609,825, the entire disclosures of which are incorporated herein by reference.

When so applied, the ink composition forms a printed substrate. The printed substrate can be used to form, for example, contacts and/or channels for electrochemical (e.g., fuel), solar, and/or other types of cells by forming fine conductive or ceramic lines. Generally, the printed substrate comprises a substrate and a coextruded printed bead on the substrate, wherein the coextruded bead comprises the first ink, one of the second ink or sacrificial material, and the material having a finite yield stress or high viscosity situated between the first ink and the one of the second ink and sacrificial material.

In embodiments, the bead of the printed substrate comprises an ink structure formed by the first ink embedded at least partially within the second ink or sacrificial material. The second ink or sacrificial material is desirably applied on one or both sides of the first ink. Of course, the second ink or sacrificial material can also be applied over the first ink, and/or optionally beneath the first ink, if desired. This ink structure ultimately becomes, after further processing such as firing, for example, the conductive line.

When applied by a coextruder device, the ink structure can have a desired high aspect ratio. For example, conventional screen printing techniques of applying ink compositions are suitable to provide aspect ratios of from about 0.1 to about 0.2, such as with a typical fired thickness of 10-20 microns and a width of 100-200 microns. However, the ink set, when applied as discussed above by coextrusion, can provide ink structures having much higher aspect ratios.

Such higher aspect ratios are achievable as a result of the presence of the material having a finite yield stress or high viscosity. The material having a finite yield stress or high viscosity maintains the mechanical dimensions of the ink structure, as it was coextruded, against a variety of forces that would otherwise cause the structure to deform before its shape can be set by drying and/or firing. In ink sets such as the present disclosure, where the first ink substantially lacks a yield stress or a high viscosity, such deformation would otherwise result in undesirable ink structures.

For example, in the absence of the material having a finite yield stress or a high viscosity, the force of gravity would slump the ink structure into a flat pool of ink before the structure could be dried or fired, instead of the desired shape of the ink structure as coextruded. This occurs because the first ink substantially lacks a yield stress or a high viscosity, and so is easily deformed by nearly any applied force. However, in the present disclosure, the material having a finite yield stress or a high viscosity supports the shape of the ink structure against such forces. A material with a yield strength of at least 100 Pa is not deformed under typical amounts of such forces, and a material with a high viscosity will not significantly deform under typical amounts of such forces in the intervening time between the printing of a structure and its post-processing via drying and firing. The forces may include, for example, not only gravity, but also surface tension forces, drying forces and wetting forces.

The ink structure can have minimum aspect ratios of about 0.2 or greater, or about 0.3 greater, or about 0.4 or greater, and maximum aspect ratios of up to about 1, up to about 2, or up to about 5. Although higher aspect ratios may also be achieved, aspect ratios above about 2 or about 3 tend to provide diminishing returns in many applications such as for solar cells, in that lesser benefit is obtained, and the features can become more fragile or more difficult to process. In embodiments, the aspect ratio in the unfired state can be, for example, from about 0.2 to about 10, such as about 0.3 to about 5 or about 0.4 or about 0.5 to about 1 or about 2 or about 3.

Likewise, although it is understood that the structure shrinks during sintering, the structure after firing, in embodiments, can have minimum aspect ratios of about 0.2 or greater or about 0.3 greater or about 0.4 or greater, and maximum aspect ratios of up to about 1, up to about 2, up to about 3, or up to about 5. In embodiments, the fired structures can have higher aspect ratios, such as above about 10 or above about 20, although they tend to provide diminishing returns in many applications such as for solar cells. In embodiments, the aspect ratio in the fired state can be, for example, from about 0.2 or from about 0.3 or from about 0.4 or about 0.5 to about 1 or about 2, such as about 0.3 to about 3 or about 0.4 or about 0.5 to about 2.

In embodiments, the ink structure in its unfired state can have a width of from about 10 to about 100 microns, such as about 10 to about 90 microns or about 10 to about 75 microns, and a height of from about 25 to about 250 microns, such as about 25 to about 100. For example, the width can be about 10 to about 25 microns, about 25 to about 50 microns, about 50 to about 75 microns, or the like, and the height can be about 25 to about 50 microns, about 50 to about 75 microns, about 75 to about 100 microns, about 100 to about 150 microns, or the like.

FIG. 1 shows an embodiment of a coextruded print system according to the present disclosure. Coextruded bead 105 is coextruded onto substrate 101. The first ink 104 is surrounded on two sides by a sacrificial material 102. At the interface of the first ink 104 and the sacrificial material 102, a material having a finite yield stress or a high viscosity 103 is formed. As a result of the presence of this material having a finite yield stress or a high viscosity, the structure 106 formed by the first ink 104 has a high aspect ratio because it does not slump under gravitational forces.

Figure 2:
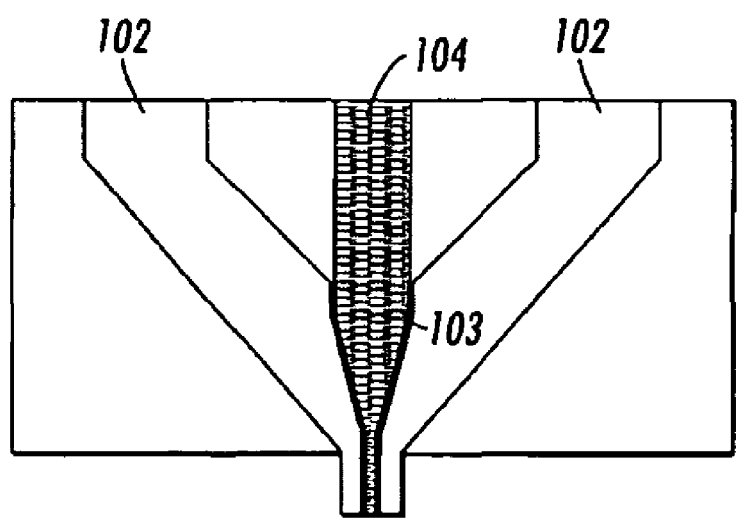
FIG. 2 shows a coextrusion printhead in the process of coextruding the ink set of the present disclosure.

FIG. 2 shows a coextrusion printhead in the process of coextruding the ink set of the present disclosure. First ink 104 is surrounded on two sides by a sacrificial material 102. Where the first ink 104 and sacrificial material 102 interface, a material having a finite yield stress or a high viscosity 103 is formed. In this way, the two materials can be coextruded without substantially mixing.

The ink set compositions of the disclosure can be used in a variety of applications where high aspect ratio conductive metal lines are desired. For example, particular applications include use in forming conductive lines for solar cell fabrication, use in forming barrier ribs (pixel separators) in plasma display panels, forming components of thick film heaters, forming components in fuel cell applications, and the like. The ink set compositions of the disclosure can be used both to form high aspect ratio lines, as well as higher conductivity lines for these and other applications.

One particular advantageous use of the compositions and methods of the disclosure is thus in solar cell production.

EXAMPLES

The disclosure will be illustrated in greater detail with reference to the following Example, but the disclosure should not be construed as being limited thereto. In the following example, all the "parts" as given by weight unless otherwise indicated.

Example

A first ink contains diethylene glycol butyl ether as an organic solvent, functional particles of PTFE, and trimethylpropane triacrylate (TMPTA) monomer. A sacrificial material contains diethylene glycol buthyl ether as an organic solvent, and diethoxyacetophenone (DEAP) photopolymerization initiator. The two fluid streams are combined in the coextruder device to produce a printed bead comprising the first ink embedded at least partially within the second ink or sacrificial material, and this bead is subjected to UV exposure to polymerize the interface of the two inks. The resulting structure comprised of the first ink is observed to maintain dimensions of 50 microns in height and 50 microns in width, and does not experience slumping.

It will be appreciated that various of the above disclosed and other features and functions, or alternative thereof, may be desirable combined into many other different systems or applications. Also, various presently unforeseen or unanticipated alternatives, modifications, variations or improvements therein may be subsequently made by those skilled in the art which are also intended to be encompasses by the following claims.

What is claimed is:

1. A coextruded ink derived from a coextrusion ink set comprised of:
    a first ink having a yield stress less than 100 Pa and a zero-shear viscosity less than 50 Pa*s;
    one of a second ink or a sacrificial material, the second ink or sacrificial material having a yield stress less than 100 Pa and a zero-shear viscosity less than 50 Pa*s;
    wherein the coextruded ink includes an interface layer having a yield stress greater than 100 Pa or a zero-shear viscosity greater than 50 Pa*s and wherein, the interface layer is formed between the first ink and the one of the second ink or sacrificial material as a result of localized mixing of the first ink and the one of the second ink or sacrificial material.

2. The coextruded ink of claim 1, wherein the interface layer of coextruded ink prevents mixing of the first ink and the one of the second ink or sacrificial material beyond the localized mixing that forms the coextruded ink.

3. The coextruded ink of claim 1, wherein the first ink further comprises solid particles.

4. The coextruded ink of claim 3, wherein the solid particles comprise at least one material selected from the group consisting of a metal, a ceramic, a polymer and a semiconductor.

5. The coextruded ink of claim 3, wherein the solid particles comprise a volume fraction in excess of 20% of the first ink.

6. The coextruded ink of claim 3, wherein the solid particles have a net electrostatic charge.

7. The coextruded ink of claim 3, wherein the solid particles are dispersed in a solvent of the first ink.

8. The coextruded ink of claim 1, wherein the interface layer of the coextruded ink formed by gelation.

9. The coextruded ink of claim 8, wherein the gelation occurs via the neutralization of electrostatic charge on the solid particles.

10. The coextruded ink of claim 1, wherein the interface layer of the coextruded ink is formed by chemical bonding of materials in the first ink and the one of the second ink or sacrificial material.

11. The coextruded ink of claim 1, wherein the interface layer of the coextruded ink has a yield stress greater than 1,000 Pa.

12. The coextruded ink of claim 1, wherein the interface layer of the coextruded ink has a thickness of greater than 1 micron.

* * * * *